United States Patent
Li et al.

(10) Patent No.: US 10,754,216 B2
(45) Date of Patent: Aug. 25, 2020

(54) ARRAY SUBSTRATE AND DRIVING METHOD THEREOF, LIQUID CRYSTAL DISPLAY PANEL, AND LIQUID CRYSTAL DISPLAY DEVICE

(71) Applicant: BOE TECHNOLOGY GROUP CO., LTD., Beijing (CN)

(72) Inventors: Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/774,111

(22) Filed: Jan. 28, 2020

(65) Prior Publication Data

US 2020/0159052 A1    May 21, 2020

Related U.S. Application Data (63) Continuation-in-part of application No. 15/038,147, filed as application No. PCT/CN2015/095173 on Nov. 20, 2015, now abandoned.

(30) Foreign Application Priority Data

May 26, 2015 (CN) ............... 2015 2 0348057 U (51) Int. Cl.
*G02F 1/1368* (2006.01)
*G02F 1/1343* (2006.01)
(Continued)

(52) U.S. Cl.
CPC ...... *G02F 1/1368* (2013.01); *G02F 1/134309* (2013.01); *G02F 1/136286* (2013.01);
(Continued)

(58) Field of Classification Search
CPC ............ G02F 1/1368; G02F 1/136286; G02F 1/136227; G02F 2001/13685; H01L 27/1251

See application file for complete search history.

(56) References Cited

U.S. PATENT DOCUMENTS

| | | |
|---|---|---|
| 5,177,475 A | 1/1993 | Stephany |
| 5,529,863 A | 6/1996 | Swirbel |

(Continued)

FOREIGN PATENT DOCUMENTS

| | | |
|---|---|---|
| CN | 102411241 | 4/2012 |
| CN | 102914928 | 2/2013 |

(Continued)

OTHER PUBLICATIONS

International Search Report and Written Opinion from PCT/CN2015/095173 dated Mar. 4, 2016.

(Continued)

*Primary Examiner* — James A Dudek
(74) *Attorney, Agent, or Firm* — Calfee, Halter & Griswold LLP (57) ABSTRACT

An array substrate having a plurality of pixel units arranged in an array where each pixel unit has a first switching structure, a second switching structure, a first pixel electrode, and a second pixel electrode. The first switching structure has a first gate, a first source, a first drain, and a first active layer located between the first source and the first drain; the first gate is on a side of the first active layer. The first pixel electrode is on a side of the first active layer away from the first gate and electrically connected to the first drain. A projection of the first pixel electrode on a plane where the first active layer resides at least partially overlaps with the first active layer; a projection of the second pixel (Continued)

electrode on a plane where the second active layer resides does not overlap with the second active layer.

20 Claims, 6 Drawing Sheets

(51) Int. Cl.
*H01L 27/12* (2006.01)
*G02F 1/1362* (2006.01)

(52) U.S. Cl.
CPC ........ *H01L 27/124* (2013.01); *H01L 27/1251* (2013.01); *G02F 2001/13685* (2013.01); *G02F 2001/136218* (2013.01)

(56) References Cited

U.S. PATENT DOCUMENTS

| | | | |
|---|---|---|---|
| 5,877,836 | A | 3/1999 | Miura |
| 5,986,723 | A | 11/1999 | Nakamura et al. |
| 6,040,885 | A | 3/2000 | Koike |
| 6,313,898 | B1 | 11/2001 | Numano |
| 7,102,723 | B2 | 9/2006 | Byun |
| 7,580,104 | B2 | 8/2009 | Komeno |
| 7,880,846 | B2 | 2/2011 | Motomatsu |
| 8,054,432 | B2 | 11/2011 | Motomatsu |
| 8,233,119 | B2 | 7/2012 | Gotoh |
| 8,355,090 | B2 | 1/2013 | Kwon et al. |
| 8,514,356 | B2 | 8/2013 | Shirmoto |
| 9,257,458 | B2 | 2/2016 | Shiromoto |
| 9,575,365 | B2 | 2/2017 | Shiromoto |
| 9,927,657 | B2 | 3/2018 | Shiromoto |
| 2003/0090603 | A1 | 5/2003 | Chae et al. |
| 2005/0213002 | A1 | 9/2005 | Wen |
| 2007/0008263 | A1 | 1/2007 | Kim |
| 2008/0252835 | A1 | 10/2008 | Motomatsu |
| 2011/0019142 | A1 | 1/2011 | Inoue et al. |
| 2011/0084278 | A1 | 4/2011 | Cho et al. |
| 2011/0127531 | A1 | 6/2011 | Kim |
| 2011/0176097 | A1 | 7/2011 | Shiromoto |
| 2011/0241004 | A1 | 10/2011 | Ishii |
| 2011/0255041 | A1 | 10/2011 | Inoue |
| 2013/0077002 | A1 | 3/2013 | Yoon |
| 2015/0380434 | A1 | 12/2015 | Cheng et al. |
| 2016/0291367 | A1 | 10/2016 | Cheng et al. |
| 2016/0363828 | A1* | 12/2016 | Guo ................. G02F 1/136286 |
| 2017/0123256 | A1* | 5/2017 | Li ...................... G02F 1/13439 |

FOREIGN PATENT DOCUMENTS

| | | |
|---|---|---|
| CN | 103185996 | 7/2013 |
| CN | 103323990 | 9/2013 |
| CN | 203930287 | 11/2014 |
| CN | 204065625 | 12/2014 |
| CN | 204758983 | 11/2015 |
| JP | 2006309239 | 11/2006 |
| JP | H3992797 B2 | 10/2007 |
| JP | 2011028013 | 2/2011 |
| JP | 2011221072 | 11/2011 |
| KR | 10-2006-0074547 | 7/2006 |
| KR | 10-2008-0048872 | 6/2008 |
| KR | 10-2009-0015737 | 2/2009 |
| KR | 10-2011-0060567 | 6/2011 |

OTHER PUBLICATIONS

Office action from Japanese Application No. 2016-567905 dated Apr. 22, 2019.
Office action from Korean Application No. 10-2017-7000631 dated Jun. 4, 2018.
Search Report from European Application No. 15860011.4 dated Jan. 3, 2019.
Office action from Mexican Patent Application No. MX/a/2015/000370 dated Jun. 26, 2018.
First Office Action for Brazilian Patent Application No. 112017000259-0 dated Apr. 22, 2020.
First Office Action for Indian Patent Application No. 201747007548 dated Dec. 31, 2019.

* cited by examiner

ARRAY SUBSTRATE AND DRIVING METHOD THEREOF, LIQUID CRYSTAL DISPLAY PANEL, AND LIQUID CRYSTAL DISPLAY DEVICE

CROSS-REFERENCE TO RELATED APPLICATIONS

The present application is a continuation-in-part of application Ser. No. 15/038,147, filed on May 20, 2006 and entitled "ARRAY SUBSTRATE, LIQUID CRYSTAL DISPLAY PANEL AND LIQUID CRYSTAL DISPLAY DEVICE", which is the U.S. national phase entry of PCT/CN2015/095173, with an international filing date of Nov. 20, 2015, and claims the benefit of Chinese Patent Application No. 201520348057.0, filed on May 26, 2015, the entire disclosures of which are incorporated herein by reference.

TECHNICAL FIELD

The present disclosure relates to the field of display technologies, and particularly to an array substrate, a liquid crystal display panel and a liquid crystal display device.

BACKGROUND

Liquid crystal display devices have beneficial characteristics, including low power consumption, no radiation, and the like, and are predominant in the field of plane display currently.

The liquid crystal display panel in existing liquid crystal display devices usually comprises an array substrate and a color film substrate arranged opposite to each other, and a liquid crystal layer filled between the array substrate and the color film substrate. The array substrate is provided with a plurality of pixel units and each pixel unit is provided with one pixel electrode. The color film substrate is provided with a common electrode. The deflection angle of the liquid crystal molecules within the liquid crystal region to which the pixel unit corresponds can be controlled by means of an electric field formed between the pixel electrode and the common electrode, thereby carrying out the liquid crystal display function.

However, in the existing array substrate, since each pixel unit only comprises one pixel electrode, under the effect of the electric field formed by the pixel electrode and the common electrode, the liquid crystal molecules within the liquid crystal region to which a single pixel unit corresponds all have the same deflection angle, thus resulting in a small visual angle of the liquid crystal display device in the prior art.

SUMMARY

It is an object of the present disclosure to provide an array substrate, and a liquid crystal display panel and display device, which can at least partially alleviate the problem existing in the prior art.

An exemplary embodiment provides an array substrate. The array substrate may comprise a plurality of pixel units arranged in an array. Each pixel unit comprises a first switching structure, a second switching structure, a first pixel electrode, and a second pixel electrode. For each pixel unit, the first switching structure comprises a first gate, a first source, a first drain, and a first active layer located between the first source and the first drain; the first gate is on a side of the first active layer; the first pixel electrode is on a side of the first active layer away from the first gate and electrically connected to the first drain; the second switching structure comprises a second gate, a second source, a second drain, and a second active layer located between the second source and the second drain; the second pixel electrode is electrically connected to the second drain; a projection of the first pixel electrode on a plane where the first active layer resides at least partially overlaps with the first active layer; a projection of the second pixel electrode on a plane where the second active layer resides does not overlap with the second active layer; the first gate, the first source, the first drain, and the first active layer form a structure of bottom gate thin film transistor; the first pixel electrode, the first source, the first drain, and the first active layer form a structure of top gate thin film transistor.

In the array substrate provided by an exemplary embodiment, each pixel unit may comprise the first switching structure and the second switching structure. A first channel region (i.e., the first active layer) is provided between the first source and the first drain. The projection of the first pixel electrode on the plane where the first active layer resides at least partially overlaps with the first active layer; the projection of the second pixel electrode on the plane where the second active layer resides does not overlap with the second active layer. The first gate, the first source, the first drain, and the first active layer form the structure of bottom gate thin film transistor. The first pixel electrode, the first source, the first drain, and the first active layer form the structure of top gate thin film transistor. Since the first pixel electrode is on the side of the first active layer away from the first gate, the first active layer can be controlled by either the first gate or a portion of the first pixel electrode overlapping with the first active layer. Moreover, each first pixel electrode is electrically connected to the first drain. When the first pixel electrode is charged, carrier migration is generated within the first active layer such that the first active layer is conducting, i.e., the structure of top gate thin film transistor is in a switch-on state, thereby enabling the first pixel electrode to release partial voltage through the structure of top gate thin film transistor. Therefore, when the one or more first pixel electrodes and the second pixel electrode in the same pixel unit are charged, the voltages of the one or more first pixel electrodes are lower than the voltage of the second pixel electrode, such that the deflection angle of the liquid crystal molecules within the liquid crystal regions to which the one or more first pixel electrodes correspond is smaller than the deflection angle of the liquid crystal molecules within the liquid crystal region to which the second pixel electrode corresponds. The one or more first pixel electrodes release the voltage at different rates through the corresponding structures of top gate thin film transistor, such that the respective first pixel electrodes may have different voltages. The different voltages enable the liquid crystal molecules within the corresponding liquid crystal regions to have different deflection angles, that is, the liquid crystal molecules within the liquid crystal region to which the same pixel unit corresponds have different deflection angles. Accordingly, as compared to the prior art that the deflection angles of the liquid crystal molecules within the liquid crystal region to which the same pixel unit corresponds are identical, in the array substrate provided by an exemplary embodiment, the liquid crystal molecules within the liquid crystal region to which the same pixel unit corresponds at least have two deflection angles, thereby significantly increasing the visual angle of the liquid crystal display device.

In some exemplary embodiments, the array substrate further comprises a plurality of data lines extending in a first direction and a plurality of gate lines extending in a second direction; the second source and the second gate are arranged in different layers; the second source consists of a segment of data line in a region where the data lines intersect the gate lines, and the second gate consists of a segment of gate line in a region where the gate lines intersect the data lines.

In some exemplary embodiments, the first pixel electrode and the second pixel electrode are located at two sides of a corresponding gate line, respectively.

In some exemplary embodiments, the second source is circular arc-shaped.

In some exemplary embodiments, a common electrode is further provided between the first pixel electrode and the second pixel electrode; the common electrode is provided with a shielding electrode that extends to the second pixel electrode and is located between two adjacent second pixel electrodes.

In some exemplary embodiments, the shielding electrode is strip-shaped.

In some exemplary embodiments, the shielding electrode has two fork arms arranged in parallel.

In some exemplary embodiments, the shielding electrode is located between two adjacent data lines; at two sides of the shielding electrode, a portion of the data line which corresponds to each of the second pixel electrodes has a recess recessed inwards the second pixel electrode.

In some exemplary embodiments, the first drain is electrically connected to the first pixel electrode via a first via hole; a projection of the first via hole on a plane where the common electrode resides is located within the common electrode.

In some exemplary embodiments, the second drain is electrically connected to the second pixel electrode via a second via hole; a projection of the second via hole on a plane where the common electrode resides is located within the common electrode.

A second exemplary embodiment provides a liquid crystal display panel comprising the array substrate provided by the above technical solution.

A third exemplary embodiment provides a liquid crystal display device comprising the liquid crystal display panel provided by the above technical solution.

A fourth exemplary embodiment further provides a method for driving the array substrate provided by the above technical solution.

BRIEF DESCRIPTION OF THE DRAWINGS

The figures described here are used to provide further understanding of exemplary embodiments and constitute a part of the present disclosure. The illustrative exemplary embodiments of the present disclosure and explanations thereof are used to interpret the present disclosure and should not be construed to limit the disclosed embodiments in any manner.

DETAILED DESCRIPTION

In order to further explain the array substrate and the display device provided by the exemplary embodiments presented herein, detailed description will be provided below with reference to the drawings.

Figure 6:
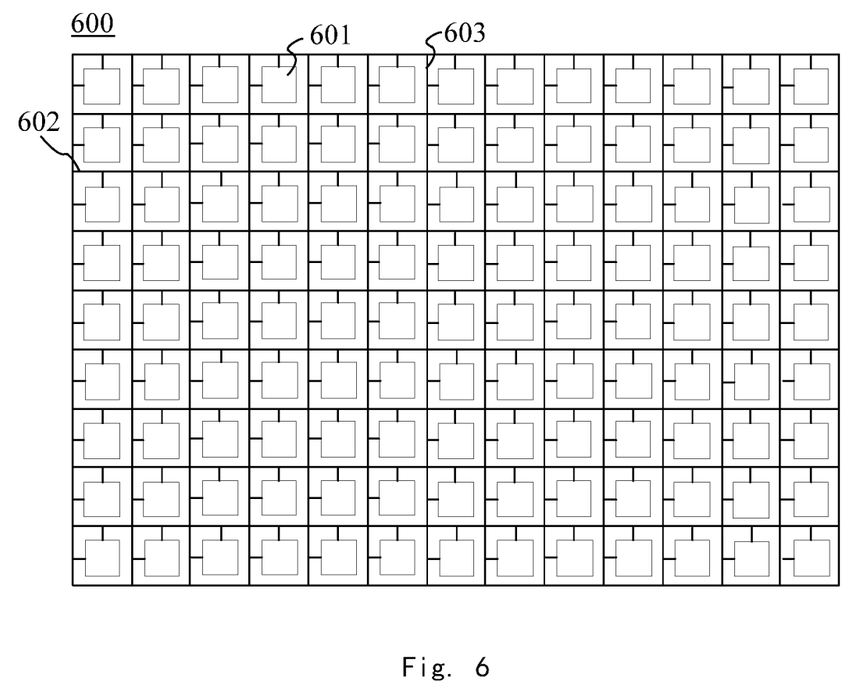
FIG. 6 is a structural schematic diagram of an array substrate according to an exemplary embodiment.

Exemplary embodiment provide an array substrate comprising a plurality of pixel units arranged in an array. As shown in FIG. 6, each pixel unit 601 in the array substrate 600 may connect to a gate line 602 and a data line 603.

FIGS. 1, 3, 5, 7, and 8 are structural schematic diagrams, each of which shows a pixel unit in an array substrate shown in FIG. 6.

Figure 1:
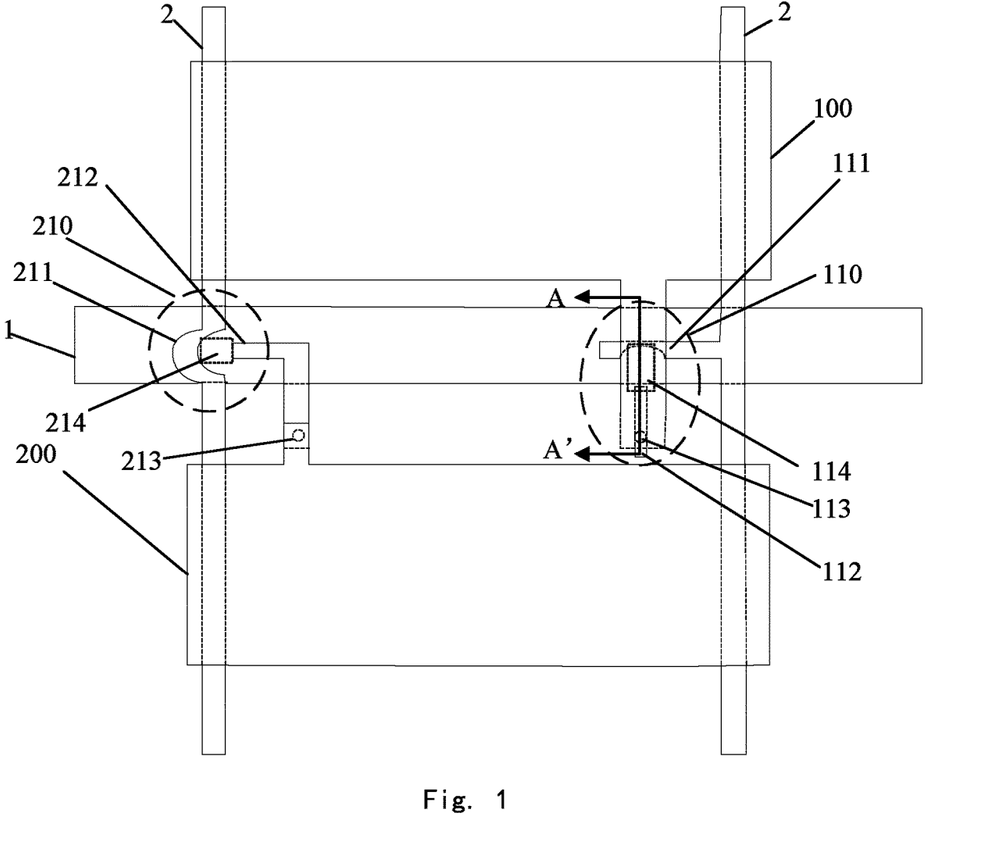
FIG. 1 is a structural schematic diagram of a pixel unit in an array substrate according to an exemplary embodiment.
Figure 2:
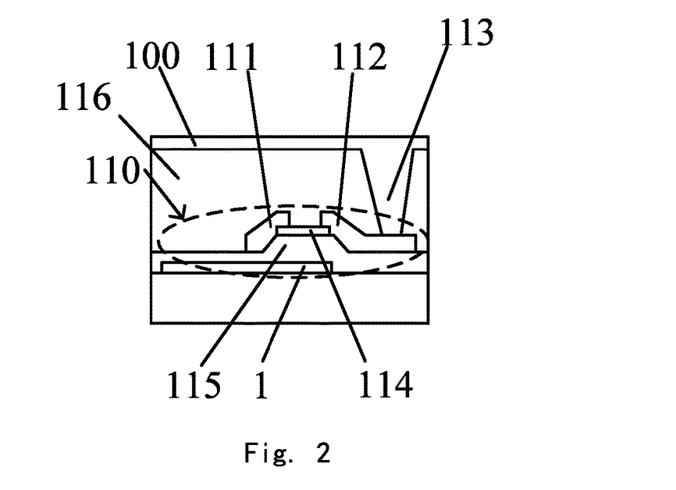
FIG. 2 is a cross section view of the first switching structure in the pixel unit in FIG. 1 along line A-A'.

In an exemplary embodiment, referring to FIGS. 1 and 2, each pixel unit comprises a first switching structure 110, a second switching structure 210, a first pixel electrode 100, and a second pixel electrode 200. For each pixel unit, the first switching structure 110 comprises a first gate, a first source 111, a first drain 112, and a first active layer 114 located between the first source 111 and the first drain 112; the first gate is on a side of the first active layer 114; the first pixel electrode 100 is on a side of the first active layer 114 away from the first gate and electrically connected to the first drain 112; the second switching structure 210 comprises a second gate, a second source 211, a second drain 212, and a second active layer 214 located between the second source 211 and the second drain 212; the second pixel electrode 200 is electrically connected to the second drain 212; a projection of the first pixel electrode 100 on a plane where the first active layer 114 resides at least partially overlaps with the first active layer 114; a projection of the second pixel electrode 200 on a plane where the second active layer 214 resides does not overlap with the second active layer 214; the first gate, the first source 111, the first drain 112, and the first active layer 114 form a structure of bottom gate thin film transistor; the first pixel electrode 100, the first source 111, the first drain 112, and the first active layer 114 form a structure of top gate thin film transistor.

In the context of the present disclosure, the "structure of bottom gate thin film transistor" refers to a thin film transistor in which the gate (i.e. gate electrode) is located under the channel region (i.e. active layer) of the thin film transistor, and the "structure of top gate thin film transistor" refers to a thin film transistor in which the gate (i.e. gate electrode) is located over the channel region (i.e. active layer) of the thin film transistor. In exemplary embodiments, the type of the second switching structure is not limited. The second switching structure may be a bottom gate thin film transistor or a top gate thin film transistor.

Figure 3:
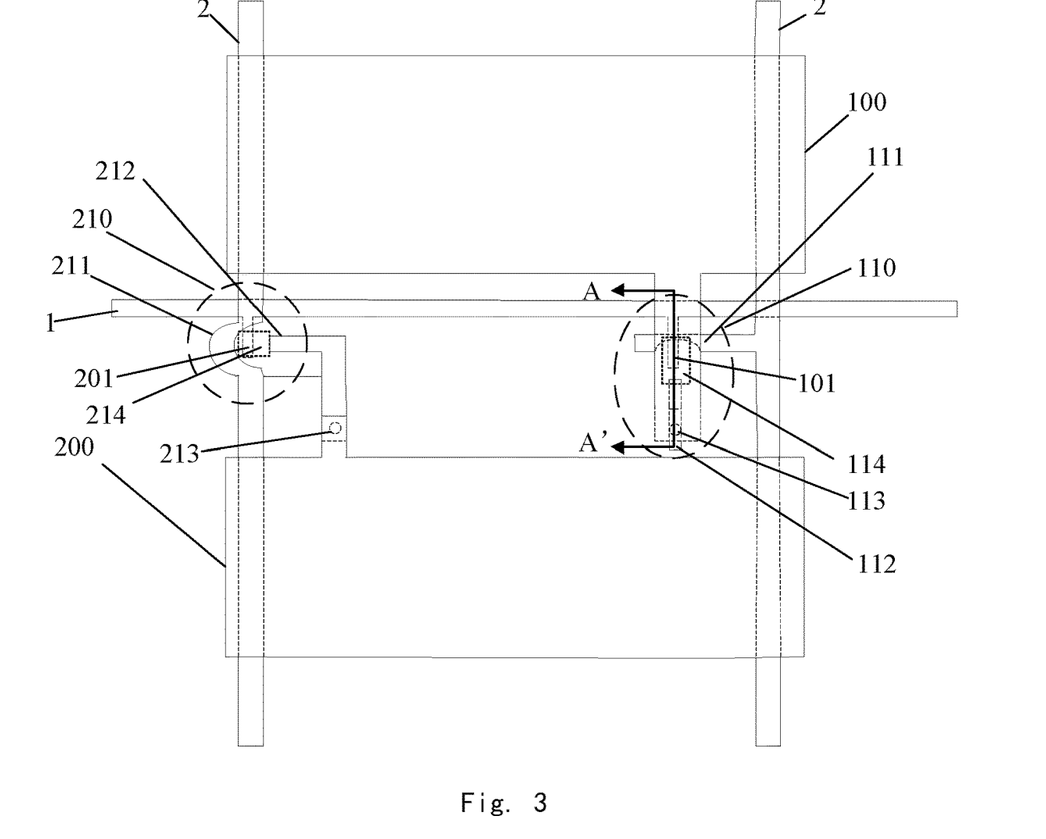
FIG. 3 is a structural schematic diagram of a pixel unit in an array substrate according to an exemplary embodiment.
Figure 4:
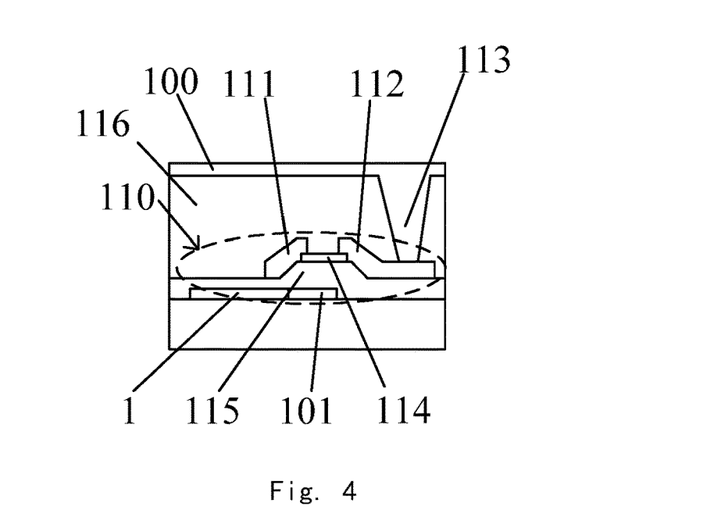
FIG. 4 is a cross section view of the first switching structure in the pixel unit in FIG. 3 along line A-A'.

As shown in FIG. 1, the gate line 1 is disposed under the first active layer 114, thus a portion of the gate line 1 overlapping with the first active layer 114 constitutes a bottom gate of the first switching structure 110, and a portion of the gate line 1 overlapping with the second active layer 214 constitutes a gate of the second switching structure 210. In the exemplary embodiment shown in FIGS. 3 and 4, the extension portions of the gate line 1 constitute a bottom gate 101 of the first switching structure 110 and a gate 201 of the second switching structure 210. The difference between FIG. 3 and FIG. 1 is that the extension portions of the gate line 1 constitute the bottom gate 101 of the first switching structure 110 and the gate 201 of the second switching structure 210.

Figure 7:
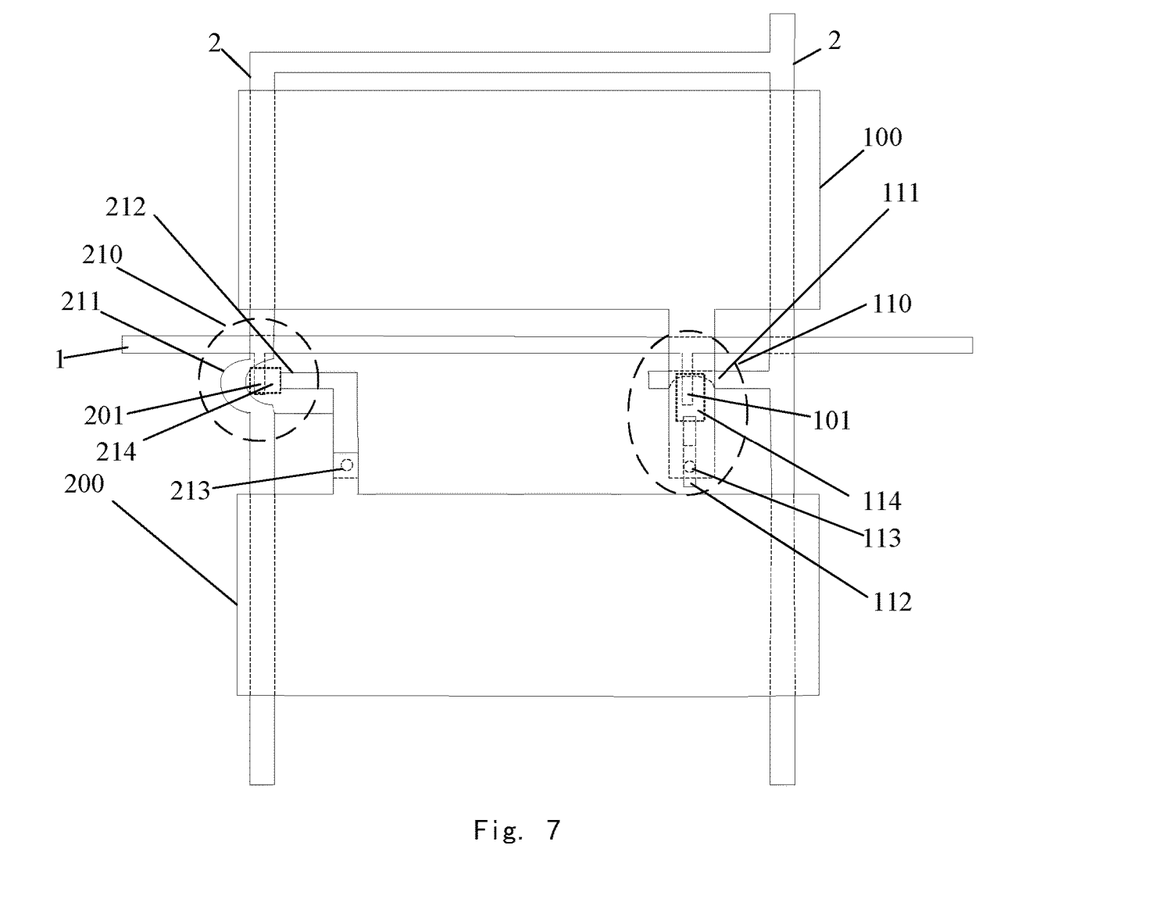
FIG. 7 is a structural schematic diagram of a pixel unit in an array substrate according to an exemplary embodiment.

According to exemplary embodiments, the data lines 2 in the same pixel unit may receive the same data signal, and this is why the first switching structure 110 and the second switching structure 210 should to be arranged as described above. With the above-mentioned configuration, by applying the same data signal to the first pixel electrode 100 and the second pixel electrode 200, the liquid crystal molecules within the liquid crystal region to which the same pixel unit corresponds at least have two deflection angles, thereby significantly increasing the visual angle of the liquid crystal display device. In an exemplary embodiment, as shown in FIG. 7, the data lines 2 in the same pixel unit are two branches of the same data line.

Upon implementation, the array substrate comprises a base substrate, and a plurality of pixel units arranged in an array on the base substrate. In each pixel unit, the first pixel electrode 100 and the second pixel electrode 200 are located at the top of the pixel unit. The first pixel electrode 100 is used as the gate of the structure of top gate thin film transistor, the first drain 112 is used as the source of the structure of top gate thin film transistor, the first source 111 is further used as the drain of the structure of top gate thin film transistor, and the first pixel electrode is electrically connected to the first drain 112.

In exemplary embodiments, each pixel unit includes at least two pixel electrodes with configuration forms different from each other. The second switching structure is thus controlled only by the gate line, while the first switching structure in the same pixel unit can be controlled by the gate line and the first pixel electrode. By virtue of the above setting, when the first pixel electrode is charged, there is carrier migration in the gate of the structure of top gate thin film transistor (i.e. first pixel electrode 100), such that the first active layer is conducting, i.e. the structure of top gate thin film transistor is in a switch-on state, thereby the first pixel electrode 100 can release partial voltage to a data line 2 through the structure of top gate thin film transistor, such that in the same pixel unit, the discharge rate of the first pixel electrode 100 is higher than that of the second pixel electrode 200, thereby causing the voltage of the first pixel electrode 100 to be lower than that of the second pixel electrode 200, further making the field intensity of an electric field formed by the first pixel electrode 110 and a common electrode on a color film substrate lower than the field intensity of an electric field formed by the second pixel electrode 200 and the common electrode on the color film substrate. The liquid crystal region to which the same pixel unit corresponds is substantially divided into a low voltage domain to which the first pixel electrode 100 corresponds and a high voltage domain to which the second pixel electrode 200 corresponds. Accordingly, under the effects of the above electric fields with different field intensities, the electric field force acting on the liquid crystal molecules within the low voltage domain is smaller than the electric field force acting on the liquid crystal molecules within the high voltage domain, such that the deflection angle of the liquid crystal molecules within the low voltage domain is smaller than that of the liquid crystal molecules within the high voltage domain, that is, the liquid crystal molecules within the liquid crystal region to which the same pixel unit corresponds have different deflection angles. Therefore, as compared to the prior art that the liquid crystal molecules within the liquid crystal region to which the same pixel unit corresponds have identical deflection angles, in the array substrate provided by the present disclosure, even if the same data signal is applied to the first pixel electrode(s) and the second pixel electrode in the same pixel unit, the liquid crystal molecules within the liquid crystal region to which the same pixel unit corresponds at least have two deflection angles, thereby significantly increasing the visual angle of the liquid crystal display device.

Figure 5:
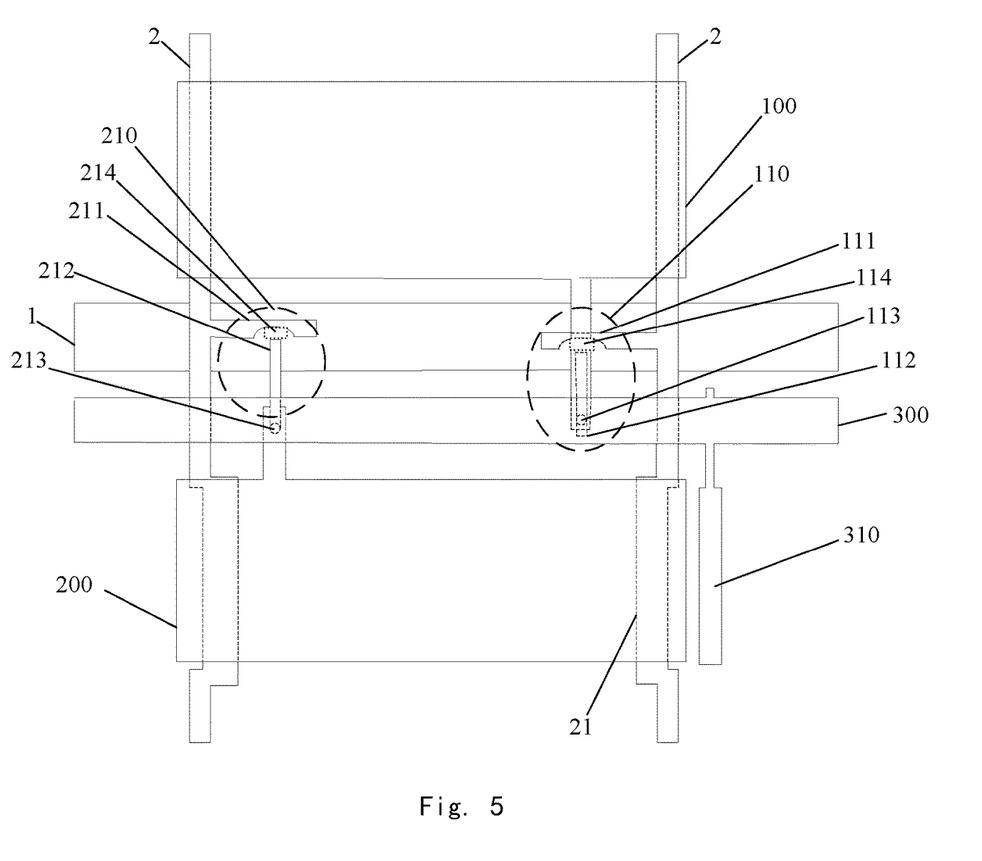
FIG. 5 is a structural schematic diagram of a pixel unit in an array substrate according to an exemplary embodiment.

In exemplary embodiments, the projection of the first pixel electrode 100 on the plane where the first active layer 114 resides may cover the whole first active layer 114, as shown in FIGS. 1, 3, 7, and 8, and may also cover only a part of the first active layer 114, as shown in FIG. 5. Since in general case the discharge rate of the first pixel electrode 100 through the structure of top gate thin film transistor is positively correlated with the area of the first active layer 114 covered by the projection of the first pixel electrode 100 on the plane where the first active layer 114 resides, upon implementation, those skilled in the art can reasonably adjust the area of the first active layer 114 covered by the projection of the first pixel electrode 100 according to the discharge rate of the first pixel electrode 100 through the structure of top gate thin film transistor and the size of the wiring space on the array substrate.

Figure 8:
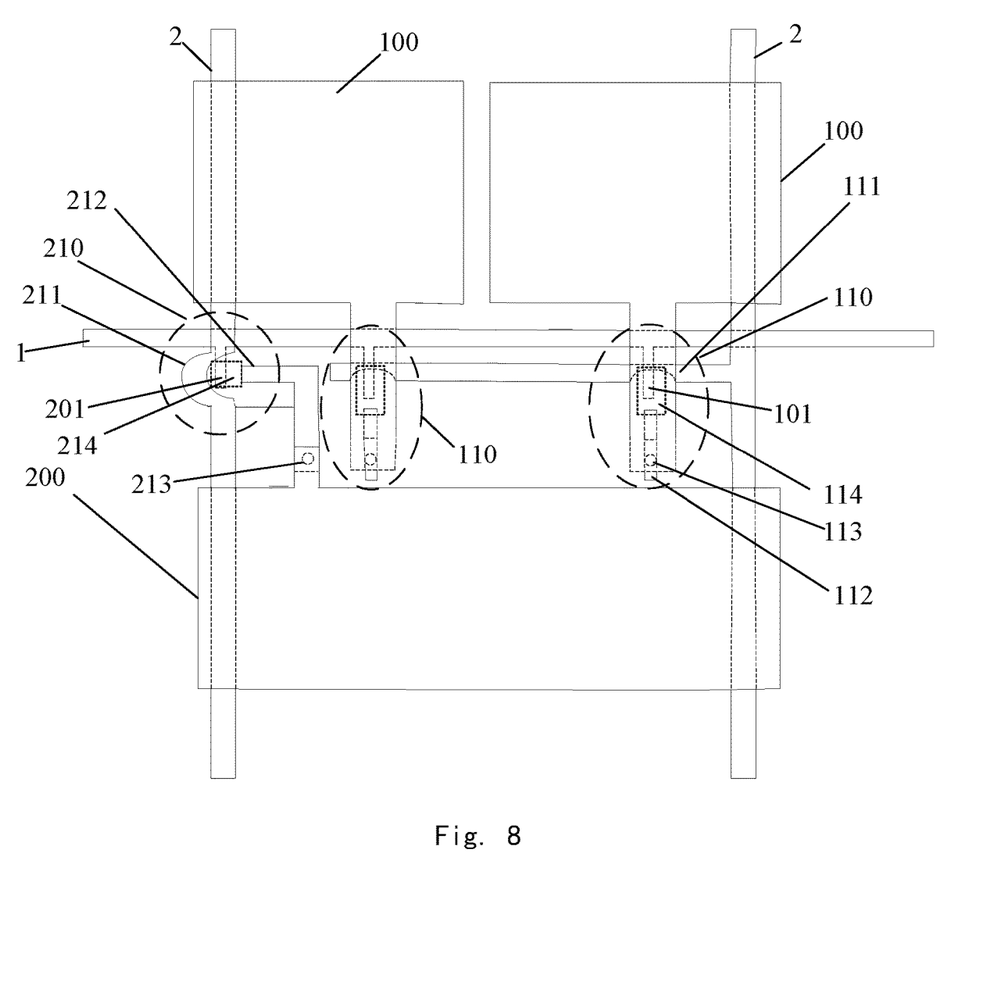
FIG. 8 is a structural schematic diagram of an array substrate according to an exemplary embodiment.

In some exemplary embodiment, as shown in FIG. 8, each pixel unit may be provided with at least two first pixel electrodes 100. Each first pixel electrode 100 is driven by a corresponding first switching structure 110. There is a first active layer 114 between a source 111 and a drain 112 of each first switching structure 110. The projection of the first pixel electrode 100 corresponding to the first switching structure 110 on the plane where the first active layer 114 resides at least partially covers the first active layer 114, and for each first switching structure 110, the area of the portion of the first active layer 114 covered by the projection of the first pixel electrode 100 is not equal, so as to constitute a different structure of top gate thin film transistor corresponding to each first pixel electrode 100. By means of the above measure, in the same pixel unit, when the first pixel electrodes 100 and the second pixel electrode 200 are charged, the discharge rates of respective first pixel electrodes 100 through corresponding structure of top gate thin film transistors are set to be different to make the respective first pixel electrodes 100 have different voltages. The different voltages enable the liquid crystal molecules within respective low voltage domains to have different deflection angles, and additionally, the deflections angle of the liquid crystal molecules within the high voltage domain is also different from the deflection angles of the liquid crystal molecules within the respective low voltage domains. Therefore, in the embodiments of the present disclosure, the liquid crystal molecules within the liquid crystal region to which the same pixel unit corresponds at least have three different deflection angles, which significantly increases the visual angle of the liquid crystal display device as compared to the prior art that the liquid crystal molecules within the liquid crystal region to which the same pixel unit corresponds only have one deflection angle.

Referring to FIG. 1, as regards the above technical solution, the array substrate further comprises a plurality of data lines extending in a first direction and a plurality of gate lines extending in a second direction, and the second switching structure 210 comprises a source 211 and a gate arranged in different layers, the second source 211 consists of a segment of data line in the region where the data line 2 intersects the gate line 1, and the gate consists of a segment of gate line in the region where the gate line 1 intersects the data line 2. Specifically, the gate line 1 is located in a gate layer in the pixel unit, and the data line 2 is located in a source drain metal layer in the pixel unit where the first source 111, the second source 211, the first drain 112 and the second drain 212 are located. At the time of performing patterning process for the gate layer and the source drain metal layer, a segment of data line 2 in the region where the data line 2 intersects the gate line 1 is directly used as the second source 211, and the gate line 1 within the region is used as the second gate, without the need to additionally arrange connecting wires for the second source 211 and the second gate, respectively, on the base substrate. This can not only simplify the patterning process for the gate layer and the source drain metal layer, but also decrease the total area of the wires on the array substrate and increase the aperture ratio of the substrate, thereby producing better display effect. Furthermore, in accordance with an illustrative embodiment of the present disclosure, the first pixel electrode 100 and the second pixel electrode 200 in the same pixel unit are located at two sides of a data line, respectively. For example, the first pixel electrode 100 and the second pixel electrode 200 in the same pixel unit are located at two sides of the gate line 1, respectively, such that both the first pixel electrode 100 and the second pixel electrode 200 are close to the gate line 1 so as to reduce the length of the wire for connecting the second pixel electrode 200 to the second switching structure 210 and the length of the wire for connecting the first pixel electrode 100 to the first switching structure 110, thereby further simplifying the patterning process for the gate layer and the source drain metal layer, decreasing the total area of the wires on the array substrate, and increasing the aperture ratio of the substrate, thereby producing better display effect.

Referring to FIG. 1 and FIG. 2, further, the shape of the second source 211 is set as a circular arc. The circular arc-shaped source 211, as compared to an I-shaped source, increases the length of the second active layer 214 between the second source 211 and the second drain 212, and further increases an average aspect ratio W/L of the second active layer 214 (the width W is the length of the second active layer 214, L is the width of the cross section of the second active layer 214; in this embodiment, the width W is in direct proportion to the length of the circular arc-shaped partial data line 2). When the second switching structure 210 is in a switch-on state, the charge current $I_{on}$ thereof and the aspect ratio W/L of the second active layer 214 have the following relationship:

$$I_{on} = \frac{1}{2}\mu_n C_{ox} \frac{W}{L}(V_{gs} - V_{th})^2 V_{gs}$$

$V_{gs}$ is a potential difference between the gate and the source, and $V_{th}$ is an initial excited voltage of charges for conduction band of the active layer, i.e. a threshold voltage. $C_{ox}=\varepsilon_0\varepsilon_{ox}/d_{ox}$, in the formula $C_{ox}$ is a capacitance of a unit area of the gate insulating layer 115, $\varepsilon_0$ is a vacuum dielectric constant, $\varepsilon_{ox}$ is a dielectric constant of the gate insulating layer 115, and $d_{ox}$ is a thickness of the gate insulating layer 115. $\mu_n$ is a mobility of electronic carriers of the active layer.

As can be known from the above relationship, the charge current of the second switching structure 210 is in direct proportion to the aspect ratio of the second active layer 214 thereof. For the above reason, the second source 211 is set as a circular arc such that the second active layer 214 between the second source 211 and the second drain 212 becomes longer to thereby increase the aspect ratio of the second active layer 214 of the second switching structure 210 and further increase the charge current of the second switching structure 210 to increase the voltage obtained by the second pixel electrode 200 upon charging and further increase the difference between the voltage of the first pixel electrode 100 and the voltage of the second pixel electrode 200 in the same pixel unit, thereby further increasing the difference between the deflection angle of the liquid crystal molecules within the low voltage domain and the deflection angle of the liquid crystal molecules within the high voltage domain such that the angle between the deflection angle of the liquid crystal molecules within the low voltage domain and the deflection angle of the liquid crystal molecules within the high voltage domain is larger, thereby further enlarging the visual angle of the liquid crystal display device.

Referring to FIG. 5, in general case, the higher the voltage possessed by the first pixel electrode 100 or the second pixel electrode 200 is, the larger the interference of the generated electromagnetic field on the signals passing through surrounding components is. Therefore, as compared to the first pixel electrode 100, the electromagnetic field generated by the second pixel electrode 200 causes more significant interference on the signals passing through surrounding components. In order to alleviate this phenomenon, as an improved solution of the above technical solution, a common electrode 300 is further provided between the first pixel electrode 100 and the second pixel electrode 200, which is provided with a shielding electrode 310 that extends to the second pixel electrode 200 and is located between two adjacent second pixel electrodes 200. By virtue of the above setting, the two adjacent second pixel electrodes 200 are isolated by the shielding electrode 310, and the electromagnetic field generated by the second pixel electrode 200 is shielded by the shielding electrode 310 to alleviate the interference of the electromagnetic field generated by the second pixel electrode 200 on the signals passing through the components in the adjacent pixel unit. In addition, the shielding electrode 310 may be strip-shaped as shown in FIG. 5, for example, a tuning fork-like shielding electrode 310. The tuning fork-like shielding electrode has two fork arms arranged in parallel, and the two fork arms shield the electromagnetic field of the second pixel electrode 200 in company with each other, which can better attenuate the impact of the electromagnetic field on surrounding components and further improve the shielding effect of the shielding electrode 310 on the electric field and the magnetic field generated by the second pixel electrode 200.

Referring again to FIG. 5, the shielding electrode 310 is located between two adjacent data lines 2, and at two sides of the shielding electrode 310, a portion of the data line 2 which corresponds to each second pixel electrode 200 has a recess 21 recessed inwards the second pixel electrode 200. Specifically, the data line 2 is located in the source drain metal layer where the sources 111, 211 and the drains 112, 212 are located. At the time of performing patterning process for the source drain metal layer, on the data line 2, corresponding to the respective adjacent second pixel electrodes 200, a segment of data line on the data line 2 is raised towards the second pixel electrode 200 to form the above recess 21 which may exhibit the shape of a rectangular pit. By virtue of the above setting, there is an appropriate spacing between part of the data line 2 nearby the second pixel electrode 200 and the shielding electrode 310, which can prevent the part of the data line 2 and the shielding electrode 310 from forming a parasitic capacitance that results in interference on the signals passing through the data line 2.

Referring to FIG. 5, as regards the above improved solution, a passivation layer 116 (shown in FIG. 2) is provided between the first drain 112 and the first pixel electrode 100, the first drain 112 is electrically connected to the first pixel electrode 100 via a first via hole 113 disposed in the passivation layer 116, and the projection of the first via hole 113 on the plane where the common electrode 300 resides is located within the common electrode 300. Specifically, the first pixel electrode 100 and the common electrode 300 have a certain opposite area at the first via hole 113 such that the first pixel electrode 100 and the common electrode form a small compensating capacitor at the first via hole 113 (the first pixel electrode 100 and the common electrode 300 act as two electrodes of the compensating capacitor, respectively). The compensating capacitor can store certain electric energy when the first pixel electrode 100 is charged and appropriately compensate the voltage of the first pixel electrode 100 when it discharges so as to prevent the first pixel electrode 100 from discharging too fast. Since too fast discharge of the first pixel electrode 100 will result in that the discharge process thereof cannot last until the start of the next charge process, the liquid crystal molecules within the low voltage domain cannot keep deflected during one charge and discharge cycle of the first pixel electrode 100, such that the low voltage domain cannot continue passing through light during one charge and discharge cycle of the first pixel electrode 100, finally resulting in blinking of pixel dots on the picture to which the pixel unit corresponds. Therefore, the embodiments of the present disclosure arrange the first via hole 113 right over the common electrode 300 to avoid blinking of pixel dots on the picture which results from too fast discharge of the first pixel electrode.

Referring to FIG. 5, as regards the above improved solution, a passivation layer 116 is provided between the second drain 212 of the second switching structure 210 and the second pixel electrode 200, the second drain 212 is electrically connected to second pixel electrode 200 via a second via hole 213 disposed in the passivation layer 116, and the projection of the second via hole 213 on the plane where the common electrode 300 reside is located within the common electrode 300. Specifically, the second pixel electrode 200 and the common electrode 300 have a certain opposite area at the second via hole 213 such that the to second pixel electrode 200 and the common electrode 300 form a small compensating capacitor at the second via hole 213. The compensating capacitor can store certain electric energy when the second pixel electrode 200 is charged and compensate the voltage of the second pixel electrode 200 to some extent when the second pixel electrode 200 discharges so as to further decrease the discharge rate of the second pixel electrode 200 such that the voltage of the second pixel electrode 200 in the same pixel unit is higher than the voltage of the first pixel electrode 100, thereby ensuring the difference between the deflection angle of the liquid crystal molecules within the low voltage domain and the deflection angle of the liquid crystal molecules within the high voltage domain, and further ensuring the visual angle of the liquid crystal display device.

Exemplary embodiments further provide a liquid crystal display panel comprising the array substrate according to any one of the above technical solutions.

The array substrate comprised in the liquid crystal display panel provided by exemplary embodiments is provided with a plurality of pixel units arranged in an array, each pixel unit comprises one or more first pixel electrodes driven by corresponding first switching structures and a second pixel electrode driven by a second switching structure, a first active layer is provided between a source and a drain of each first switching structure, the projection of each first pixel electrode on the plane of the first active layer covers at least partially the first active layer, and each first pixel electrode constitutes a structure of top gate thin film transistor in company with the first source and the first drain in the corresponding first switching structure. In each structure of top gate thin film transistor, the first pixel electrode is used as a gate, the first drain of the corresponding first switching structure is used as a source, and the first source of the corresponding first switching structure is used as a drain. In the first switching structure, the first active layer can be controlled by either the bottom gate of the structure of bottom gate thin film transistor or a portion of the first pixel electrode overlapping with the first active layer. Moreover, each first pixel electrode is electrically connected to the first drain. When the first pixel electrode is charged, carrier migration is generated within the first active layer such that the first active layer between the first source and the first drain is conducting, i.e. the structure of top gate thin film transistor is in a switch-on state, thereby enabling the first pixel electrode to release partial voltage through the structure of top gate thin film transistor. Therefore, when the one or more first pixel electrodes and the second pixel electrode are charged, in the same pixel unit the voltages of the one or more first pixel electrodes are lower than the voltage of the second pixel electrode, such that the deflection angle of the liquid crystal molecules within the liquid crystal regions to which the one or more first pixel electrodes correspond is smaller than the deflection angle of the liquid crystal molecules within the liquid crystal region to which the second pixel electrode corresponds. The one or more first pixel electrodes release the voltage at different rates through the corresponding structure of top gate thin film transistors, such that the respective first pixel electrodes have different voltages. The different voltages enable the liquid crystal molecules within the corresponding liquid crystal regions to have different deflection angles, that is, the liquid crystal molecules within the liquid crystal region to which the same pixel unit corresponds have different deflection angles. Accordingly, as compared to the prior art that the deflection angles of the liquid crystal molecules within the liquid crystal region to which the same pixel unit corresponds are identical, in the array substrate employed in the liquid crystal display panel provided by the present disclosure, the liquid crystal molecules within the liquid crystal region to which the same pixel unit corresponds at least have two deflection angles, thereby significantly increasing the visual angle of the liquid crystal display device.

Exemplary embodiments further provide a liquid crystal display device comprising the liquid crystal display panel according to the above technical solution.

A liquid crystal display device provided by an exemplary embodiment comprises a liquid crystal display panel comprising an array substrate. The array substrate is provided with a plurality of pixel units arranged in an array, each pixel unit comprises one or more first pixel electrodes driven by corresponding first switching structures and a second pixel electrode driven by a second switching structure, a first active layer is provided between a source and a drain of each first switching structure, the projection of each first pixel electrode on the plane of the first active layer covers at least partially the first active layer, and each first pixel electrode constitutes a structure of top gate thin film transistor in company with the first source and the first drain of the corresponding first switching structure. In each structure of top gate thin film transistor, the first pixel electrode is used as a gate, the first drain of the corresponding first switching structure is used as a source, and the first source of the corresponding first switching structure is used as a drain. In the first switching structure, the first active layer can be controlled by either the bottom gate of the structure of bottom gate thin film transistor or a portion of the first pixel electrode overlapping with the first active layer. Moreover, each first pixel electrode is electrically connected to the first drain. When the first pixel electrode is charged, carrier migration is generated within the first active layer such that the first active layer between the first source and the first drain is conducting, i.e. the structure of top gate thin film transistor is in a switch-on state, thereby enabling the first pixel electrode to release partial voltage through the structure of top gate thin film transistor. Therefore, when the one or more first pixel electrodes and the second pixel electrode are charged, in the same pixel unit the voltages of the one or more first pixel electrodes are lower than the voltage of the second pixel electrode, such that the deflection angle of the liquid crystal molecules within the liquid crystal regions to which the one or more first pixel electrodes correspond is smaller than the deflection angle of the liquid crystal molecules within the liquid crystal region to which the second pixel electrode corresponds. The one or more first pixel electrodes release the voltage at different rates through the corresponding structure of top gate thin film transistors, such that the respective first pixel electrodes have different voltages. The different voltages enable the liquid crystal molecules within the corresponding liquid crystal regions to have different deflection angles, that is, the liquid crystal molecules within the liquid crystal region to which the same pixel unit corresponds have different deflection angles. Accordingly, as compared to the prior art that the deflection angles of the liquid crystal molecules within the liquid crystal region to which the same pixel unit corresponds are identical, in the liquid crystal display panel employed in the liquid crystal display device provided by the present disclosure, the liquid crystal molecules within the liquid crystal region to which the same pixel unit on the array substrate corresponds at least have two deflection angles, thereby significantly increasing the visual angle of the liquid crystal display device.

Exemplary embodiments further provide a method for driving the array substrate provided by the above technical solution. The method comprises: sending a first signal to the first gate and the second gate to switch on the structure of bottom gate thin film transistor and the second switching structure, thereby charging the first pixel electrode and the second pixel electrode; sending a second signal to the first gate and the second gate to switch off the structure of bottom gate thin film transistor and the second switching structure; and switching on the structure of top gate thin film transistor by the first pixel electrode to discharge the first pixel electrode.

The advantages possessed by the driving method and the liquid crystal display device provided by exemplary embodiments relative to the prior art are the same as those possessed by the above liquid crystal display panel relative to the prior art, which are not described here in detail for simplicity.

In the description of the above exemplary embodiments, specific features, structures, materials or characteristics may be combined in a suitable manner in any one or more embodiments or examples.

The above description merely discloses specific implementations. However, the protection scope of the present disclosure is not so limited. Any variation or substitution that can be easily conceived by the skilled person familiar with this technical field within the technical scope revealed by the present disclosure shall be covered within the protection scope of the present disclosure. Thus, the protection scope of the present disclosure shall be based on the protection scopes of the claims.

What is claimed is:

1. An array substrate, comprising:
a plurality of pixel units arranged in an array,
wherein each pixel unit comprises a first switching structure, a second switching structure, a first pixel electrode, and a second pixel electrode;
wherein for each pixel unit, the first switching structure comprises a first gate, a first source, a first drain, and a first active layer located between the first source and the first drain; the first gate is on a side of the first active layer; the first pixel electrode is on a side of the first active layer away from the first gate and electrically connected to the first drain; the second switching structure comprises a second gate, a second source, a second drain, and a second active layer located between the second source and the second drain; the second pixel electrode is electrically connected to the second drain; a projection of the first pixel electrode on a plane where the first active layer resides at least partially overlaps with the first active layer; a projection of the second pixel electrode on a plane where the second active layer resides does not overlap with the second active layer; the first gate, the first source, the first drain, and the first active layer form a structure of bottom gate thin film transistor; the first pixel electrode, the first source, the first drain, and the first active layer form a structure of top gate thin film transistor.

2. The array substrate according to claim 1, wherein the array substrate further comprises a plurality of data lines extending in a first direction and a plurality of gate lines extending in a second direction; the second source and the second gate are arranged in different layers; the second source consists of a segment of data line in a region where the data lines intersect the gate lines, and the second gate consists of a segment of gate line in a region where the gate lines intersect the data lines.

3. The array substrate according to claim 2, wherein the first pixel electrode and the second pixel electrode are located at two sides of a corresponding gate line, respectively.

4. The array substrate according to claim 2, wherein the second source is circular arc-shaped.

5. The array substrate according to claim 1, wherein a common electrode is further provided between the first pixel electrode and the second pixel electrode, and wherein the common electrode is provided with a shielding electrode that extends to the second pixel electrode and is located between two adjacent second pixel electrodes.

6. The array substrate according to claim 2, wherein a common electrode is further provided between the first pixel electrode and the second pixel electrode; and wherein the common electrode is provided with a shielding electrode that extends to the second pixel electrode and is located between two adjacent second pixel electrodes.

7. The array substrate according to claim 5, wherein the shielding electrode is strip-shaped.

8. The array substrate according to claim 6, wherein the shielding electrode is strip-shaped.

9. The array substrate according to claim 7, wherein the shielding electrode has two fork arms arranged in parallel.

10. The array substrate according to claim 8, wherein the shielding electrode has two fork arms arranged in parallel.

11. The array substrate according to claim 5, wherein the shielding electrode is located between two adjacent data lines; and wherein, at two sides of the shielding electrode, a portion of the data line which corresponds to each of the second pixel electrodes has a recess recessed inwards the second pixel electrode.

12. The array substrate according to claim 6, wherein the shielding electrode is located between two adjacent data lines; at two sides of the shielding electrode; and wherein a portion of the data line which corresponds to each of the second pixel electrodes has a recess recessed inwards the second pixel electrode.

13. The array substrate according to claim 5, wherein the first drain is electrically connected to the first pixel electrode via a first via hole; a projection of the first via hole on a plane where the common electrode resides is located within the common electrode.

14. The array substrate according to claim 6, wherein the first drain is electrically connected to the first pixel electrode via a first via hole; and wherein a projection of the first via hole on a plane where the common electrode resides is located within the common electrode.

15. The array substrate according to claim 5, wherein the second drain is electrically connected to the second pixel electrode via a second via hole; a projection of the second via hole on a plane where the common electrode resides is located within the common electrode.

16. The array substrate according to claim 6, wherein the second drain is electrically connected to the second pixel electrode via a second via hole; a projection of the second via hole on a plane where the common electrode resides is located within the common electrode.

17. A liquid crystal display panel comprising the array substrate according to claim 1.

18. The liquid crystal display panel according to claim 17, wherein the array substrate further comprises a plurality of data lines extending in a first direction and a plurality of gate lines extending in a second direction; the second source and the second gate are arranged in different layers; the second source consists of a segment of data line in a region where the data lines intersect the gate lines, and the second gate consists of a segment of gate line in a region where the gate lines intersect the data lines.

19. A liquid crystal display device comprising the liquid crystal display panel according to claim 17.

20. A method for driving the array substrate according to claim 1, comprising:
sending a first signal to the first gate and the second gate to switch on the structure of bottom gate thin film transistor and the second switching structure, thereby charging the first pixel electrode and the second pixel electrode;
sending a second signal to the first gate and the second gate to switch off the structure of bottom gate thin film transistor and the second switching structure; and
switching on the structure of top gate thin film transistor by the first pixel electrode to discharge the first pixel electrode.

* * * * *